United States Patent
Cao et al.

(10) Patent No.: US 7,390,717 B2
(45) Date of Patent: Jun. 24, 2008

(54) TRENCH POWER MOSFET FABRICATION USING INSIDE/OUTSIDE SPACERS

(75) Inventors: Jianjun Cao, Torrance, CA (US); Paul Harvey, Chepstow (GB); David Kent, South Wales (GB); Robert Montgomery, South Glamorgan (GB); Kyle Spring, Temecula, CA (US)

(73) Assignee: International Rectifier Corporation, El Segundo, CA (US)

( * ) Notice: Subject to any disclaimer, the term of this patent is extended or adjusted under 35 U.S.C. 154(b) by 672 days.

(21) Appl. No.: 11/054,451

(22) Filed: Feb. 9, 2005

(65) Prior Publication Data

US 2005/0208724 A1    Sep. 22, 2005

Related U.S. Application Data

(60) Provisional application No. 60/543,164, filed on Feb. 9, 2004, provisional application No. 60/543,143, filed on Feb. 9, 2004, provisional application No. 60/543,441, filed on Feb. 9, 2004.

(51) Int. Cl.
*H01L 21/8242* (2006.01)
*H01L 21/336* (2006.01)
*H01L 21/20* (2006.01)

(52) U.S. Cl. ............ 438/270; 438/243; 438/244; 438/245; 438/246; 438/248; 438/259; 438/386; 438/388; 438/391; 438/222; 257/333; 257/353; 257/E21.546; 257/E21.548; 257/E21.549; 257/E21.55; 257/E21.551

(58) Field of Classification Search ......... 438/243–248, 438/259, 270, 386, 391, 222, 426; 257/333, 257/353, E21.546
See application file for complete search history.

(56) References Cited

U.S. PATENT DOCUMENTS 5,563,085 A * 10/1996 Kohyama ............ 438/245

(Continued)

OTHER PUBLICATIONS

A Novel Technique for Fabricating High Reliaboe Trench DMOSFETs Using Self-Align Technique and Hydrogen Annealing, Jongdae Kim et al., IEEE Transactions on Electron Devices, vol. 50, No. 2, Feb. 2003.

*Primary Examiner*—Michael S. Lebentritt
*Assistant Examiner*—Mohsen Ahmad
(74) *Attorney, Agent, or Firm*—Ostrolenk, Faber, Gerb & Soffen, LLP

(57) ABSTRACT

A fabrication process for a trench type power semiconductor device includes forming inside spacers over a semiconductor surface. Using the spacers as masks, trenches with gates are formed in the semiconductor body. After removing the spacers, source implants are formed in the semiconductor body along the trench edges and are then driven. Insulation caps are then formed over the trenches. Outside spacers are next formed along the sides of the caps. Using these spacers as masks, the semiconductor surface is etched and high conductivity contact regions formed. The outside spacers are then removed and source and drain contacts formed. Alternatively, the source implants are not driven. Rather, prior to outside spacer formation a second source implant is performed. The outside spacers are then formed, portions of the second source implant etched, any remaining source implant driven, and the contact regions formed. The gate electrodes are either recessed below or extend above the semiconductor surface.

20 Claims, 16 Drawing Sheets

U.S. PATENT DOCUMENTS

| | | | |
|---|---|---|---|
| 6,538,280 B2 | 3/2003 | Nakamura | 257/333 |
| 6,667,227 B1 * | 12/2003 | Liu et al. | 438/589 |
| 7,060,567 B1 * | 6/2006 | Hsu | 438/270 |
| 7,160,789 B2 * | 1/2007 | Park | 438/426 |
| 2006/0160298 A1 * | 7/2006 | Kwon et al. | 438/243 |
| 2007/0037341 A1 * | 2/2007 | Rueger et al. | 438/222 |

* cited by examiner

TRENCH POWER MOSFET FABRICATION USING INSIDE/OUTSIDE SPACERS

RELATED APPLICATIONS

This application is based on and claims priority to U.S. Provisional Application No. 60/543,164, filed on Feb. 9, 2004, by Robert Montgomery, entitled, "Trench FET with Inside/Outside Spacer and Single Source," to U.S. Provisional Application No. 60/543,143, filed on Feb. 9, 2004, by Kyle Spring, entitled, "Trench FET with Inside/Outside Spacer and Double Source," and to U.S. Provisional Application No. 60/543,441, filed on Feb. 9, 2004, by Jianjun Cao, Paul Harvey, David Kent, Robert Montgomery, and Kyle Spring, entitled, "Trench Power MOFET with Reduced Gate Resistance," the contents of which are herein incorporated by reference.

BACKGROUND OF THE INVENTION

1. Field of the Invention

The present invention relates generally to MOSFET fabrication, and more specifically, to MOSFET fabrication that uses spacers as masks.

2. Description of Related Art

Trench type power semiconductor devices such as power MOSFETs are well known. Referring to FIG. 1, a typical power MOSFET 10 includes a plurality of trenches 12 formed in semiconductor body 14. Semiconductor body 14 is usually a silicon die that includes an epitaxially grown silicon layer (epitaxial silicon layer) 16 of one conductivity (e.g. N-type) formed over a silicon substrate 18 of the same conductivity, but of higher concentration of impurities. A channel region 20 (sometimes referred to as body region) is formed in epitaxial silicon layer 16 and extends from the top surface of the semiconductor body to a first depth. Channel region 20 has a conductivity opposite to that of epitaxial layer 16 (e.g. P-type). Formed within channel region 20 are source regions 22, which have the same conductivity (e.g. N-type) as epitaxial silicon layer 16.

As is well known, trenches 12 extend to a depth below the depth of channel region 20 and include gate insulation 24, which may be formed with silicon dioxide, on at least the sidewalls of trenches 12. The bottom of each trench 12 is also insulated with silicon dioxide or the like and a gate electrode 26 is disposed within each trench 12. Gate electrodes 26 are typically composed of conductive polysilicon. As is illustrated in FIG. 1, gate electrodes 26 are recessed to a position below the top of the trenches and thereby below the top surface of the semiconductor body. However, gate electrodes 26 may also be "proud" electrodes, or in other words, extend out of trenches 12 and above the top surface of the semiconductor body.

A typical trench type power MOSFET further includes a source electrode 28, which is electrically connected to source regions 22, and a high conductivity contact region 30, which is also formed in channel region 20. High conductivity contact region 30 is highly doped with dopants of the same conductivity as channel region 20 (e.g. P-type) in order to reduce the contact resistance between source contact 28 and channel region 20. A typical trench type power MOSFET 10 further includes a drain electrode 32 in electrical contact with silicon substrate 18.

In operation, a voltage is applied to gate electrodes 26. When this voltage reaches a threshold value ($V_{TH}$) a channel is formed adjacent each trench 12 in channel region 20, which formed channel has the same conductivity as that of source regions 22 and the region below channel 20 in epitaxial silicon layer 16. As a result, a current may flow between source electrode 28 and drain electrode 32 of the power MOSFET.

As is well known, the density of the current that a power MOSFET may accommodate is directly proportional to the number of formed channels per unit area. Thus, the greater the number of trenches per unit area the more current a device can handle. Because of this relationship, it is desirable to pack as many trenches as possible for a given die area. This can be accomplished by either reducing the distance between trenches and/or reducing the width of each trench. However, traditional fabrication processes can limit the amount of reduction in these dimensions. For example, traditional masking methods used during the fabrication of a power MOSFET make it difficult to reduce trench width. Similarly, traditional masking methods can lead to mask misalignments. To compensate for these potential misalignments, designers may increase the size of the various regions (e.g., the source regions and high conductivity contact regions) of the MOSFET. However, increased sizes lead to larger distances between trenches.

SUMMARY OF THE INVENTION

Accordingly, it would be desirable to produce a trench type power semiconductor device that has increased cell density, thereby overcoming the above and other disadvantages of the prior art. In accordance with the present invention, power MOSFETs are fabricated through the use of inside and outside spacers that allow for the formation of gate electrode trenches with reduced widths and also allow for the self-alignment of source regions and high conductivity contact regions between each other and the trenches, which in turn allows for reduced distances between trenches. In accordance with a further aspect of the invention, shallower source regions are obtained. At least one benefit of these shallower source regions is that there is less lateral diffusion of the regions, thereby again allowing for reduced distances between trenches. As a result, power MOSFETs fabricated according to the present invention have reduced cell pitch and increased cell density. In general, the fabrication process of the present invention is applicable to power MOSFETS that have gate electrodes recessed below the top surface of the semiconductor body and to power MOSFETS that have gate electrodes that extend above the top surface of the semiconductor body.

More specifically, in accordance with a first embodiment of the present invention, a hard mask layer is first formed over the surface of a semiconductor body, which includes a substrate and epitaxial silicon layer of a first conductivity and a channel region thereupon of a second conductivity. This mask layer is then etched to form a plurality of openings that extend to and expose the surface of the semiconductor body. Inside spacers are then formed along the sidewalls of these openings such that the spacers expose a defined area of the surface of the semiconductor body. Using these spacers as masks, gate electrode trenches are formed into the channel region and epitaxial silicon layer of the semiconductor body. Notably, the use of the inside spacers to create the trenches allows for the formation of narrower trenches than a process such as photo-lithography, for example, would permit.

Thereafter, gate electrodes are formed in the trenches of the semiconductor body. Optionally, the process may also include a step for siliciding or saliciding the gate electrodes to reduce gate resistance. In accordance with this first embodiment, the gate electrodes are recessed below the top surface of the semiconductor body.

Next, the inside spacers are removed and source implant regions are formed in the channel region along the upper edges of the trenches. A diffusion drive is then carried out to form source regions. Notably, through the use of the inside spacers, the source regions are formed through self-alignment, thereby eliminating a need for a mask.

Next, using the initial openings formed in the hard mask layer, insulation caps are formed over the gate electrodes. Subsequently, the remaining hard mask layer is removed, thereby exposing the sidewalls of the insulation caps and exposing the surface of the semiconductor body that lies between the insulation caps. Thereafter, outside spacers are formed along the sidewalls of the insulation caps such that the spacers cover portions of the semiconductor body surface.

Using the outside spacers as masks, a contact etch is next performed along the surface of the semiconductor body and high conductivity contact regions are formed therein. The outside spacers are then removed and source and drain contacts formed. Notably, through the use of the outside spacers, the high conductivity contact regions are self-aligned between adjacent source regions and adjacent gate electrode trenches. Overall, by using the inside and outside spacers to self-align the source regions and high conductivity contact regions between each other and the gate electrode trenches, the distance between adjacent trenches can be reduced.

In accordance with a second embodiment of the invention, a two-phase source implant is used that results in shallower source regions as compared to the first embodiment. As indicated, shallower source regions result in less lateral diffusion of the source implants, which allows for the distance between adjacent trenches to be reduced, among other benefits.

Here, the source implant regions formed along the edges of the gate electrode trenches, as described above, are not initially driven. Rather, the diffusion drive is skipped and the insulation caps formed. Thereafter, once the remaining hard mask layer is removed as described above, a second blanket source implant is carried out to form source implant regions in the surface of the semiconductor body in the areas between adjacent insulation caps. The outside spacers are then formed covering portions of the source implant regions formed from the blanket source implant. The spacers are then used as masks to completely remove any exposed portion of the source implant regions. A source diffusion drive is then carried out to drive any remaining portions of the source implant regions, thereby creating source regions. Thereafter, high conductivity contact regions are formed in the etched regions.

In accordance with a third embodiment of the invention, the fabrication process is similar to the second embodiment. However, here, the gate electrodes are made larger to reduce gate resistance. Specifically, the gate electrodes, which again may be silicided or salicided, extend up to or above the surface of the semiconductor body, rather than being recessed.

DETAILED DESCRIPTION OF THE PREFERRED EMBODIMENTS

Figure 1:
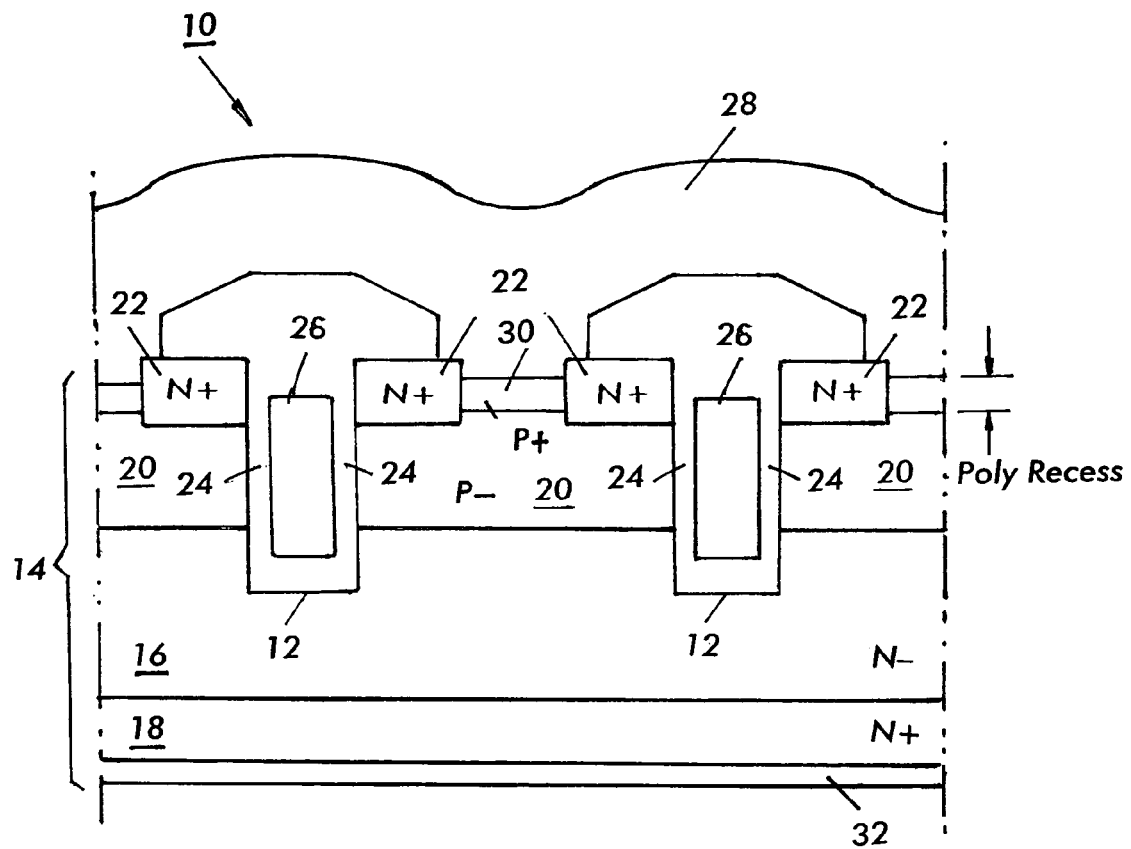
FIG. 1 shows a cross-sectional view of a trench type power MOSFET according to the prior art.
Figure 2A:
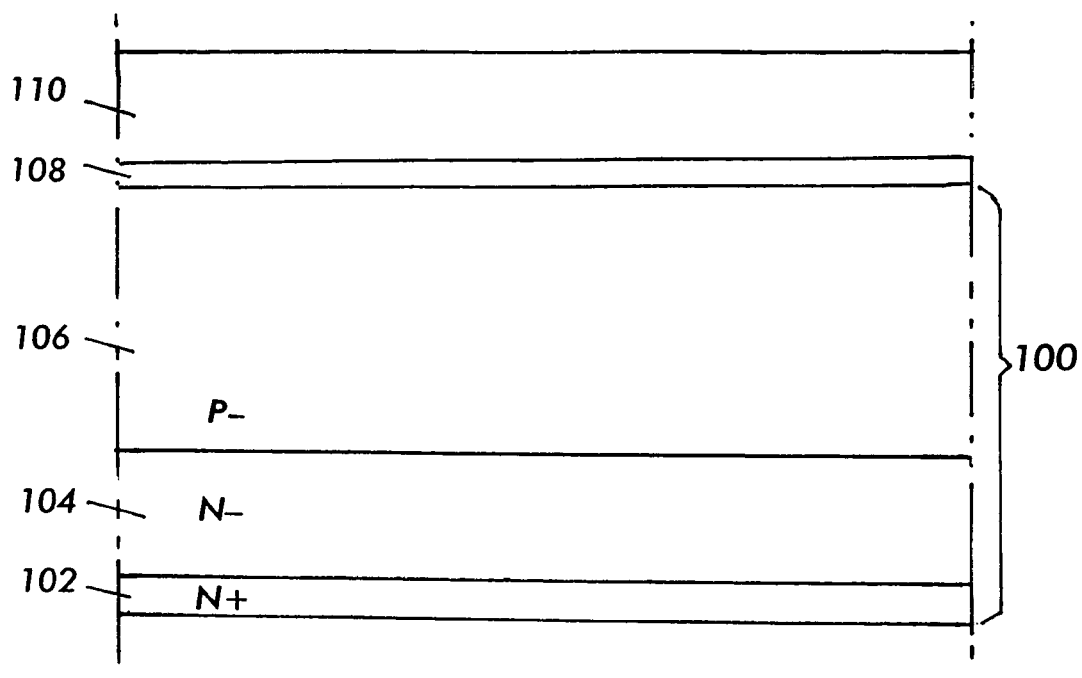
FIGS. 2A-2L graphically illustrate a fabrication process for a trench type power MOSFET according to a first embodiment of the present invention, the resulting MOSFET having gate electrodes that are recessed below the top surface of the semiconductor body.

Referring to FIGS. 2A-2L (note that the Figures are not drawn to scale), a power MOSFET fabrication process according to a first embodiment of the invention is illustrated, the fabrication process here resulting in gate electrodes that are recessed below the top surface of the semiconductor body. Beginning with FIG. 2A, there is shown an initial silicon body 100. Silicon body 100 preferably includes a silicon substrate 102 of one conductivity (e.g., N-type) and epitaxial silicon layer 104 of the same conductivity (e.g., N-type) grown over one major surface of silicon substrate 102. As is known, epitaxial silicon layer 104 includes a lower concentration of dopants as compared to substrate 102. Silicon body 100 also includes channel region 106, which has conductivity opposite to that of epitaxial silicon layer 104 (e.g. P-type). Preferably, channel region 106 is formed by implanting dopants on the surface of silicon layer 104 and driving these dopants in a diffusion drive to a desired channel depth. However, channel region 106 may also be formed by epitaxially growing the channel on the surface of layer 104. As illustrated in FIG. 2A, once channel region 106 is formed, it is covered with a pad oxide layer 108 and a removable hard mask layer 110, preferably composed of silicon nitride ($Si_3Ni_4$).

Figure 2B:
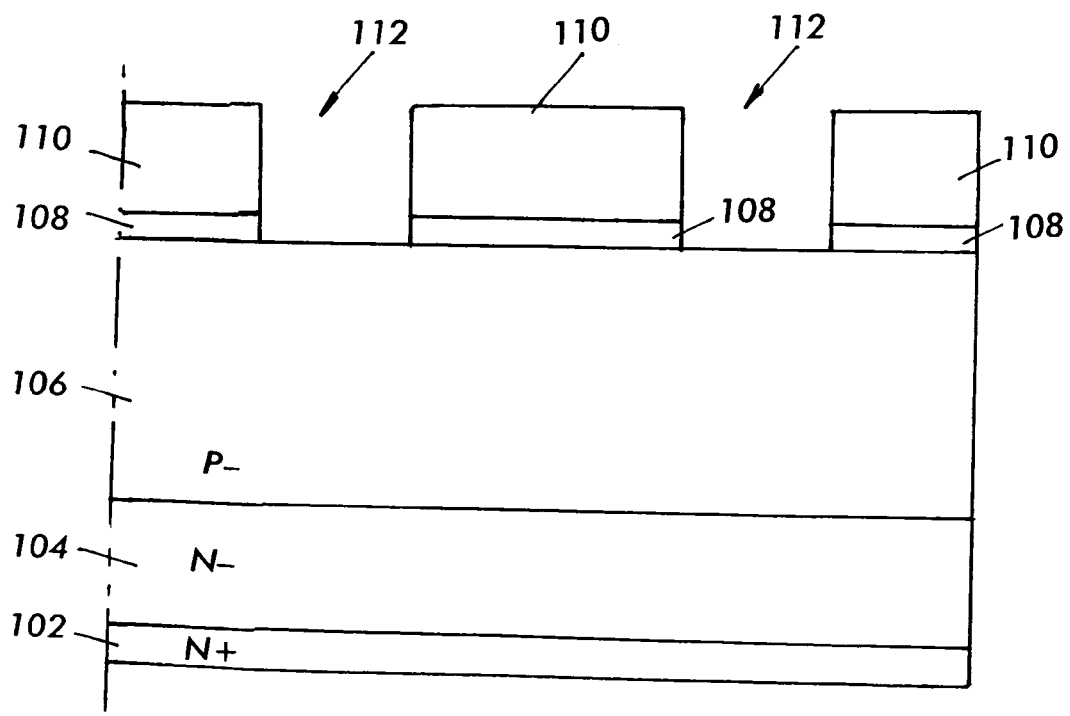

Referring to FIG. 2B, a masked pattern is next formed on the surface of mask layer 110 using, for example, a photo-lithographic process. A suitable etching process is then performed to remove the unmasked portion of hard mask layer 110 and the corresponding portion of oxide layer 108, thereby forming openings 112. As illustrated in FIG. 2B, openings 112 extend down to and thereby expose the top surface of channel region 106. As also illustrated in this Figure, each of openings 112 is separated by the remaining regions of hard mask layer 110 and oxide layer 108.

Figure 2C:
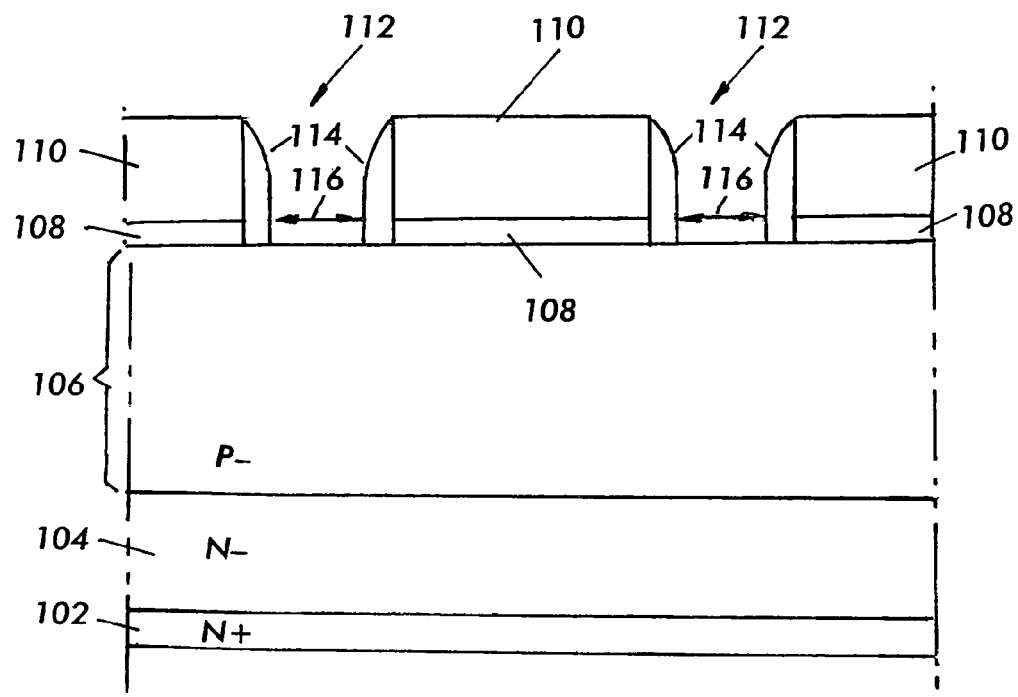

Thereafter, an oxide layer, composed from TEOS or the like for example, is formed over the surface of the structure in FIG. 2B. This oxide layer is then etched back, removing the oxide from the surface of hard mask layer 110 and more importantly, forming inside spacers 114 along the walls of openings 112, as illustrated in FIG. 2C. Significantly, the oxide removal is controlled such that inside spacers 114 expose a desired width/cross section 116 of the surface of channel region 106.

Figure 2D:
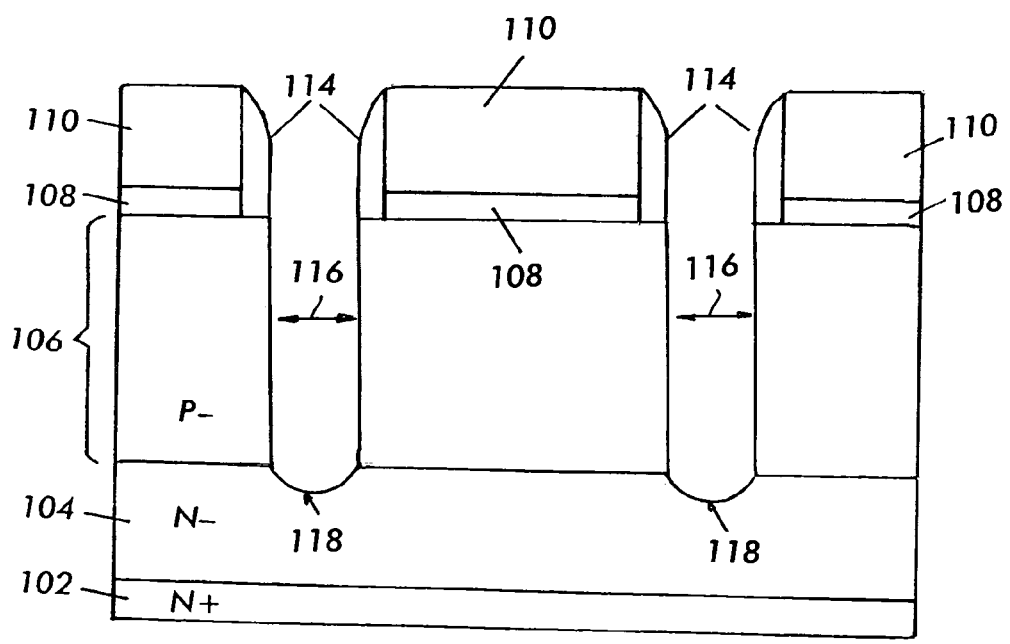

Referring to FIG. 2D, an appropriate etching process is next carried out through the inside spacers to form trenches 118 that extend from the surface of channel region 106 into epitaxial silicon layer 104. Note that inside spacers 114 act as a mask during this etching step and as such, determine the width 116 of trenches 118. Significantly, the use of spacers 114 to create trenches 118 allows for the formation of narrower trenches than a process such as photo-lithography, for example, would permit. Again, narrower trenches allow the resulting power MOSFET to have an increased cell density.

Figure 2E:
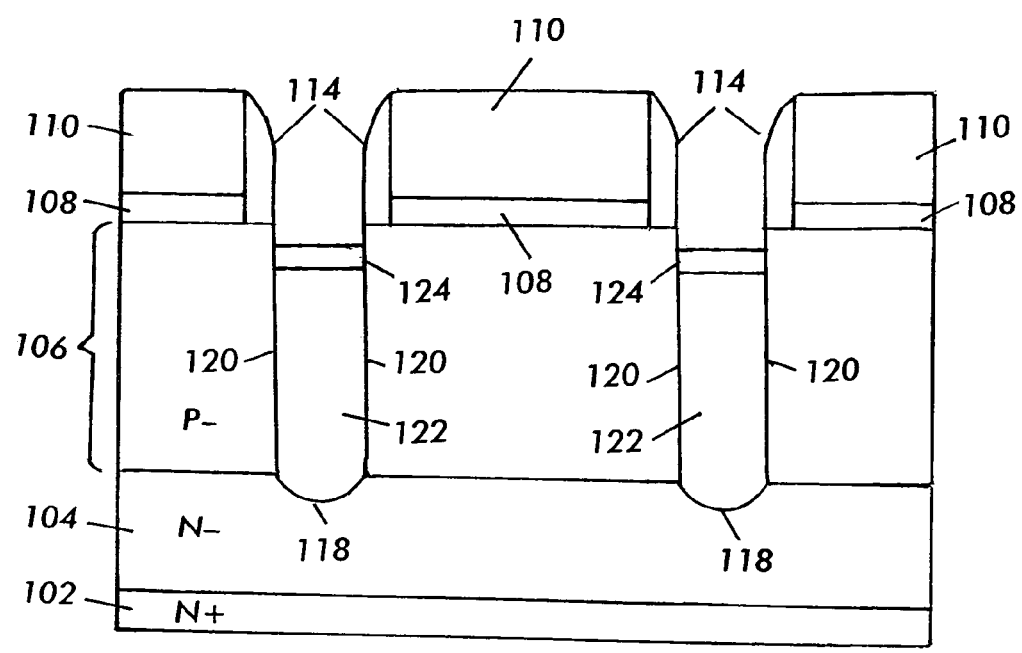

Referring next to FIG. 2E, the sidewalls and bottom surfaces of trenches 118 are oxidized to form gate oxide/insulation layers 120. Note that because of hard mask layer 110 and inside spacers 114, only the sidewalls and bottom surfaces of trenches 118 are oxidized in this step. Next, un-doped polysilicon is deposited over the surface of the structure such that the polysilicon fills trenches 118. A suitable dopant is then applied to the surface of the structure and diffused. Thereafter, the doped polysilicon is removed from the surface of the structure through appropriate masking and etching, thereby leaving gate electrodes 122 within trenches 118, as illustrated in FIG. 2E. Note that in accordance with this first embodiment of the invention, gate electrodes 122 are recessed below the top surface of trenches 118 and thereby the top surface of channel region 106.

As an option and as also illustrated in FIG. 2E, silicide or salicide contacts 124 can be formed over the top ends of each gate electrode 122 in order to reduce the local resistive value. This is desirable, for example, when trenches 118 are narrow (as described above), which results in reduced gate electrode sizes and thereby increased gate electrode resistance. Thus, for example, a layer of metal such as titanium, cobalt, or nickel is next deposited over gate electrodes 122 and over mask layer 110 and spacers 114, and is then annealed. The metal reacts with the polysilicon and silicides portions of the same. Thereafter, the unreacted portion of the metal is removed thereby forming silicide/salicide contacts 124 at the top of each gate electrode 122. Again, note that silicide/salicide contacts 124 do not extend to the top surface of channel region 106.

Figure 2F:
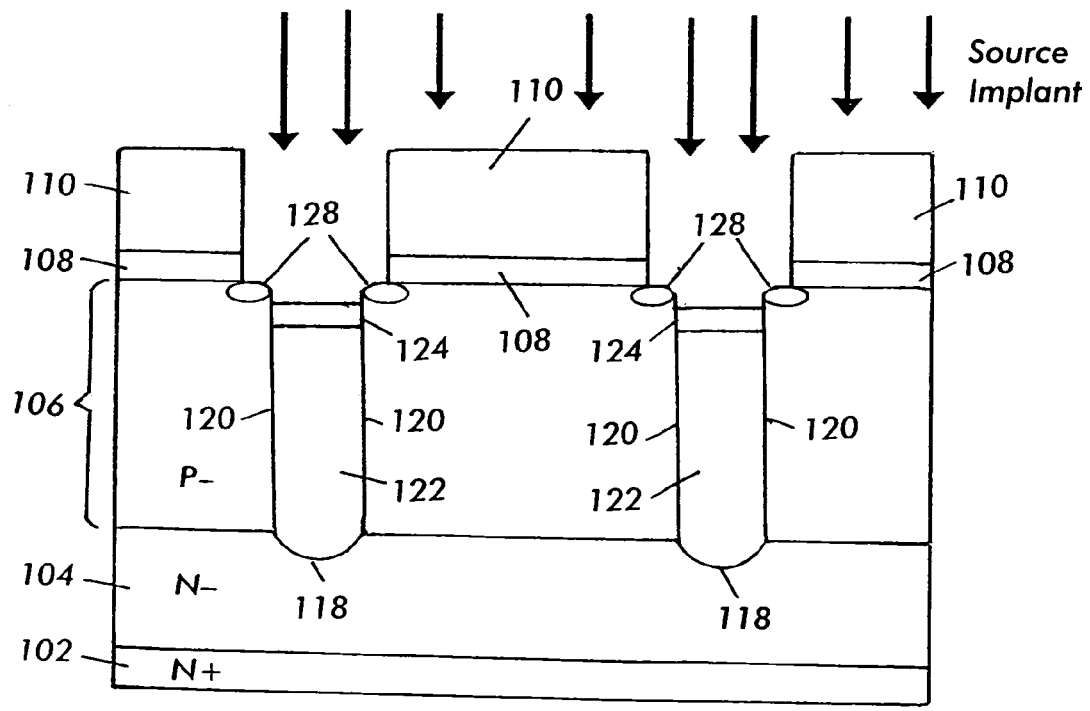
Figure 2G:
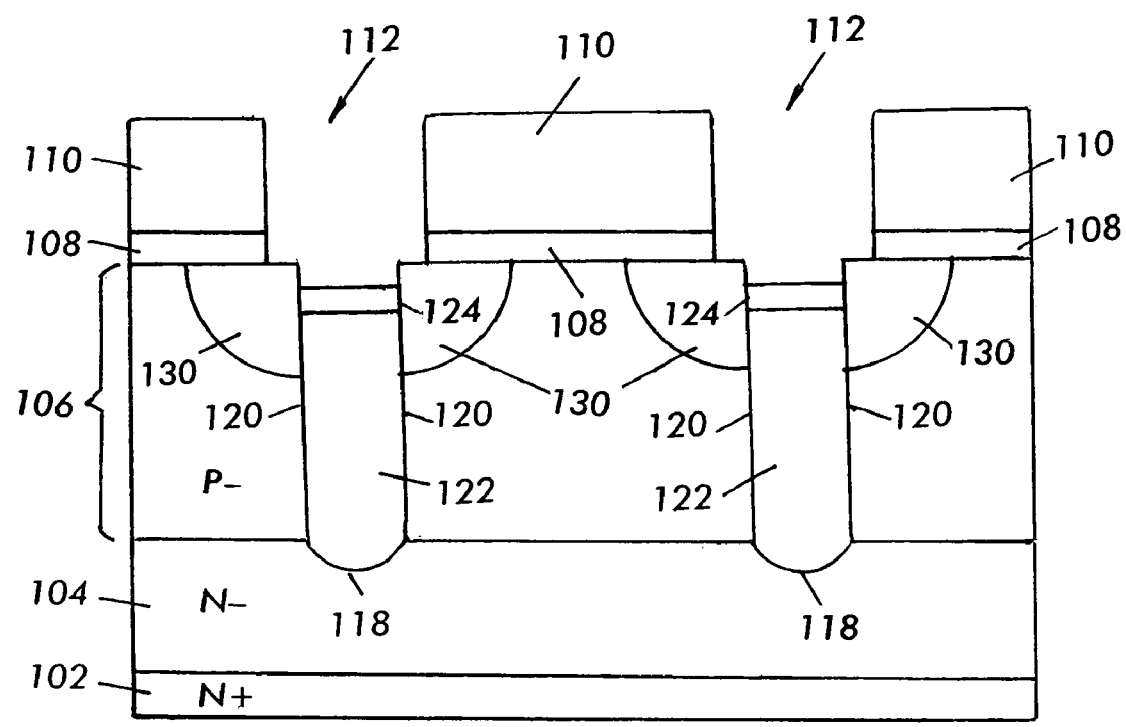

Referring to FIG. 2F, inside spacers 114 are next removed exposing a portion of channel region 106 along the upper edges of each trench 118. A source implant is then carried out thereby forming source implant regions 128 in channel region 106 along the upper edges of each trench 118. Next, as illustrated in FIG. 2G, a diffusion drive is carried out forming source regions 130 along the upper edges of the trenches. Notably, through the use of the inside spacers, the resulting source regions are formed through self-alignment, thereby eliminating the need for a mask.

Figure 2H:
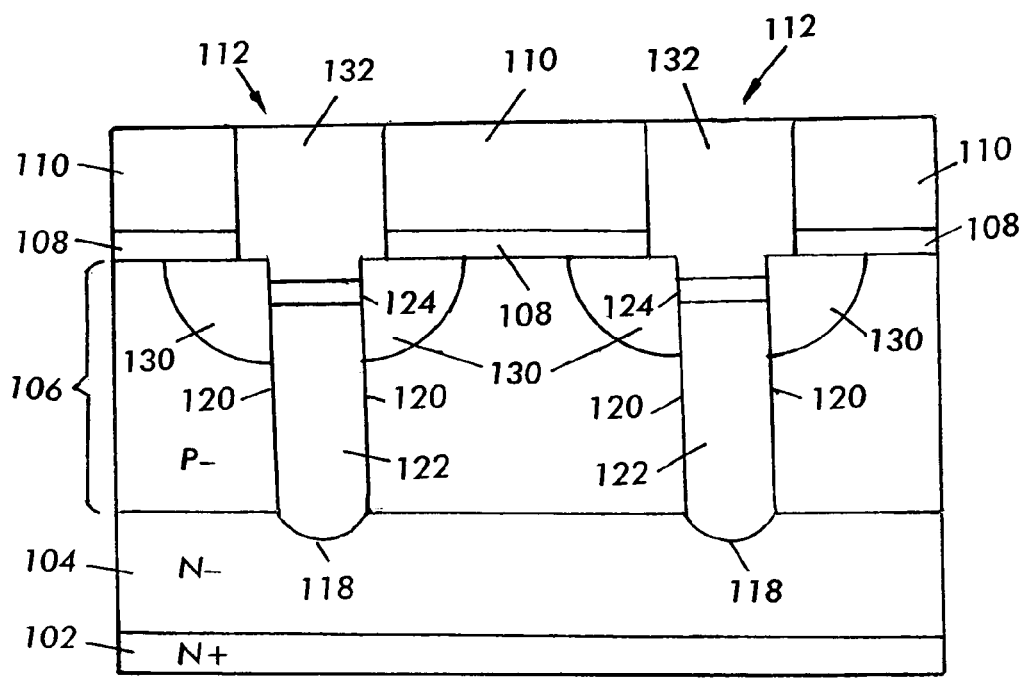

Referring to FIG. 2H, an oxide layer, composed from TEOS or the like for example, is next formed over the surface of the structure of FIG. 2G, covering hard mask layer 110 and filling openings 112. This oxide layer is then etched back forming insulation caps 132 over gate electrodes 122. Note that insulation caps 132 fill both openings 112 and also the remaining portion of trenches 118 (i.e., the portion that lies between the top of gate electrodes 122 and the top surface of channel region 106).

Figure 2I:
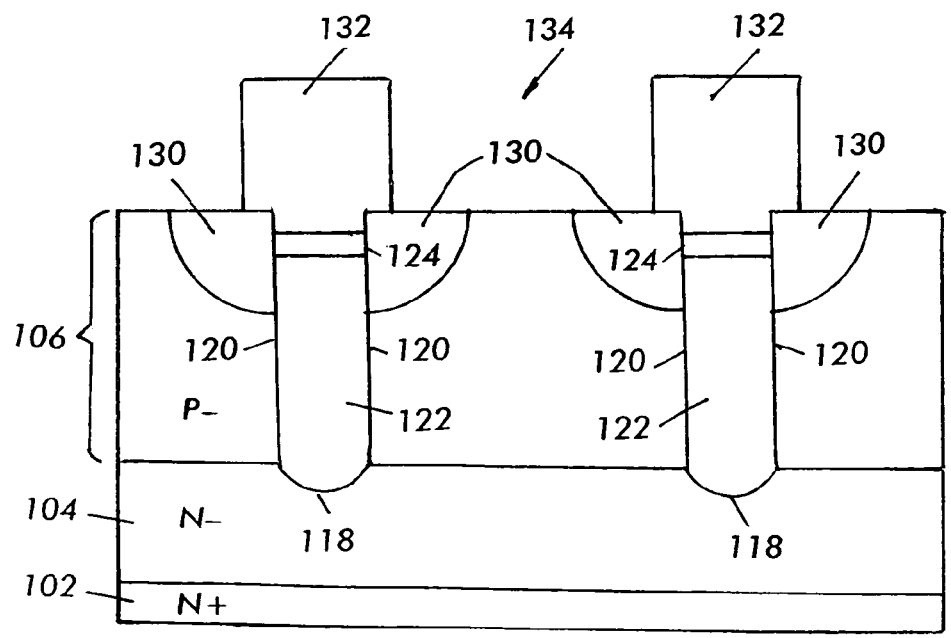
Figure 2J:
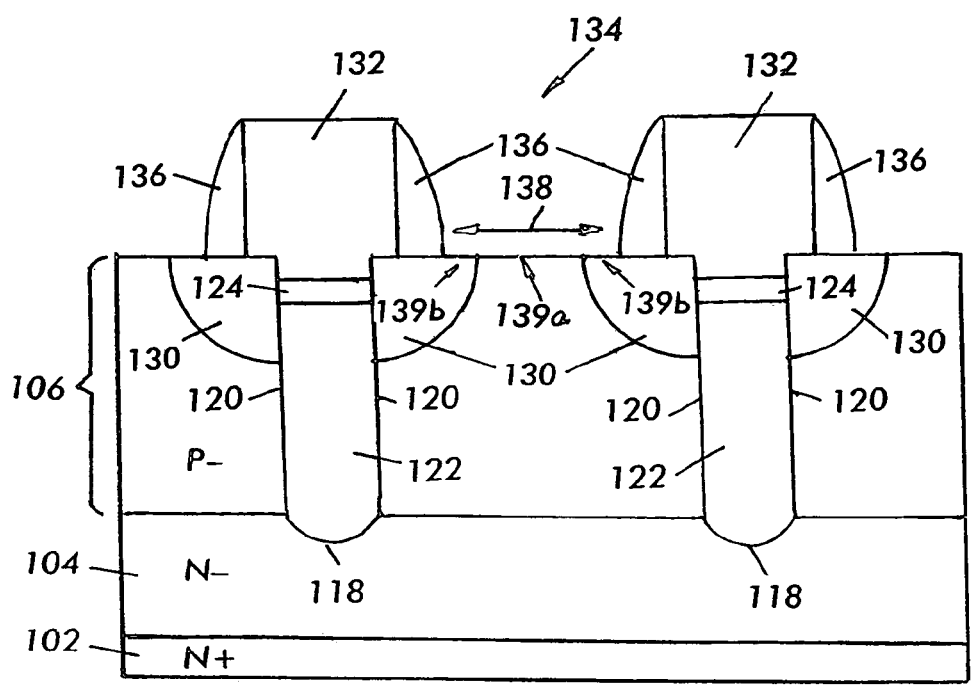

Referring to FIG. 2I, an appropriate etching process is next carried out to remove the remaining hard mask layer 110 and pad oxide layer 108. As a result, openings 134 are formed between adjacent insulation caps 132, with the bottom of each opening exposing the top surface of channel region 106 and a portion of the top surface of source regions 130 that are not covered by insulation caps 132. Thereafter, a second hard mask layer, preferably composed of silicon nitride ($Si_3Ni_4$), is formed over the surface of the structure shown in FIG. 2I, filling openings 134 and covering insulation caps 132. This second hard mask layer is then etched back, removing the mask from the top surface of insulation caps 132 and forming outside spacers 136 along the walls of insulation caps 132. The resulting structure is shown in FIG. 2J. Significantly, spacers 136 form openings of a desired width/cross-section 138 that are aligned between adjacent insulation caps 132 and thereby between adjacent source regions 130 and trenches 118. As shown, spacers 132 are sized such that the surface of channel region 106 is exposed (as illustrated by arrow 139a) and such that the surface of a desired portion of source regions 130 is exposed (as illustrated by arrows 139b).

Figure 2K:
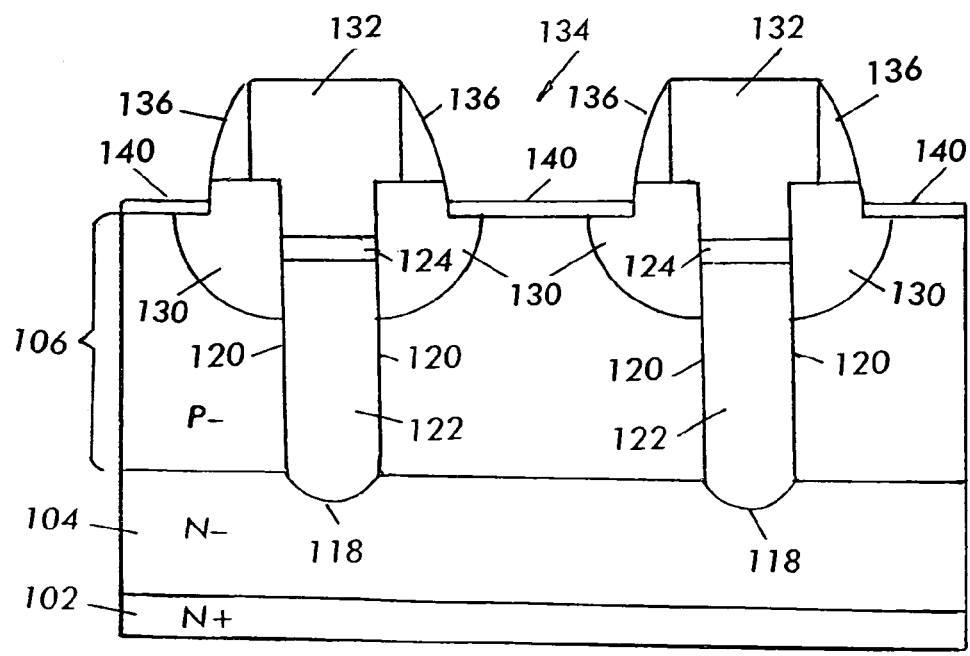

Referring to FIG. 2K, a contact etch is next performed through spacers 136, along cross-section 138, thereby using spacers 136 as a mask. This contact etch removes a portion of channel region 106 (along the region designated by arrow 139a in FIG. 2J) and removes a portion of source regions 130 (along the region designated by arrows 139b in FIG. 2J). Thereafter, dopants of the same conductivity as channel region 106 are implanted in source regions 130 and channel region 106 along the etched region and after a diffusion drive, high conductivity contact regions 140 are formed as illustrated in FIG. 2K. Again, through the use of outside spacers 136, conductivity regions 140 are self-aligned between adjacent source regions 130 and trenches 118. Overall, by using inside spacers 114 and outside spacers 136 to self-align the source regions 130 and high conductivity contact regions 140 between each other and trenches 118, the distance between adjacent trenches can be reduced. Again, this reduced distance allows the resulting power MOSFET to have an increased cell density.

Figure 2L:
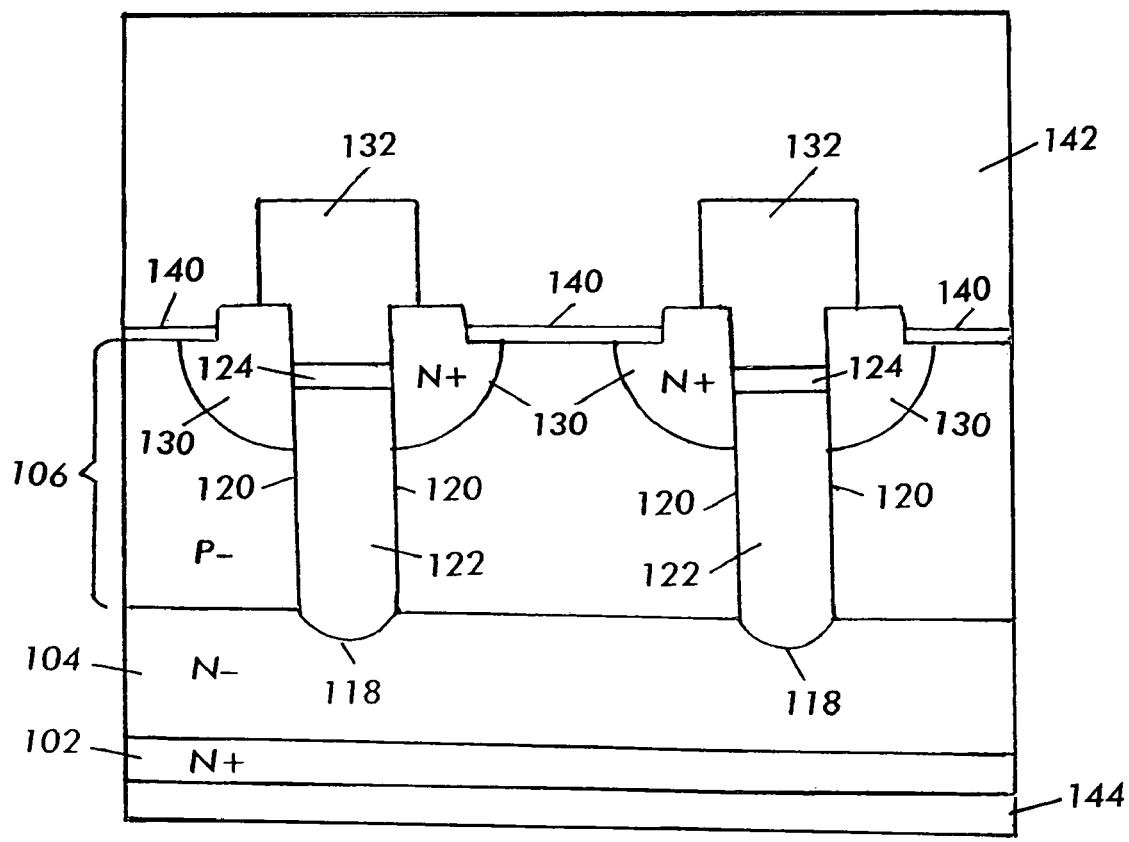

Finally, referring to FIG. 2L, once high conductivity contact regions 140 are formed, nitride spacers 136 are stripped. Thereafter, a front metal and back metal are applied using known methods to obtain source contact 142 and drain contact 144.

Figure 3A:
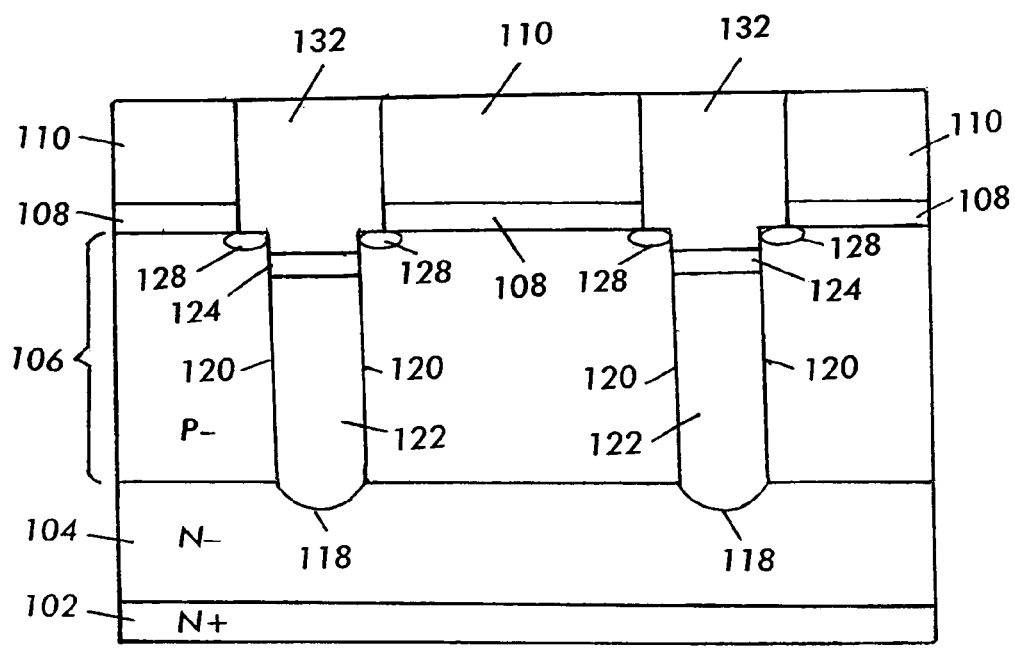
FIGS. 3A-3G graphically illustrate a fabrication process for a trench type power MOSFET according to a second embodiment of the present invention, the resulting MOSFET having shallower source regions than the MOSFET resulting from the first embodiment.

Referring now to FIGS. 3A-3G, a power MOSFET fabrication process according to a second embodiment of the invention is illustrated. This process is similar to the process of the first embodiment of the present invention but uses a two-phase source implant rather than one. This two-phase source implant results in shallower source regions as compared to those created according to the first embodiment. Significantly, shallower source regions results in less lateral diffusion of the source implant. Again, this is beneficial because it allows for the distance between adjacent trenches to be reduced. Shallower source regions also allow for reduced processing temperatures, among other benefits. Accordingly, the process of this second embodiment proceeds as described above through FIG. 2F where a source implant is carried out to form source implant regions 128 in channel region 106 along the upper edges of each trench 118. However, rather than carrying out a source diffusion drive as in FIG. 2G, this step is skipped and insulation caps 132 are formed over the gate electrodes by applying and etching back an oxide layer, composed from TEOS or the like for example. The resulting structure is illustrated in FIG. 3A.

Figure 3B:
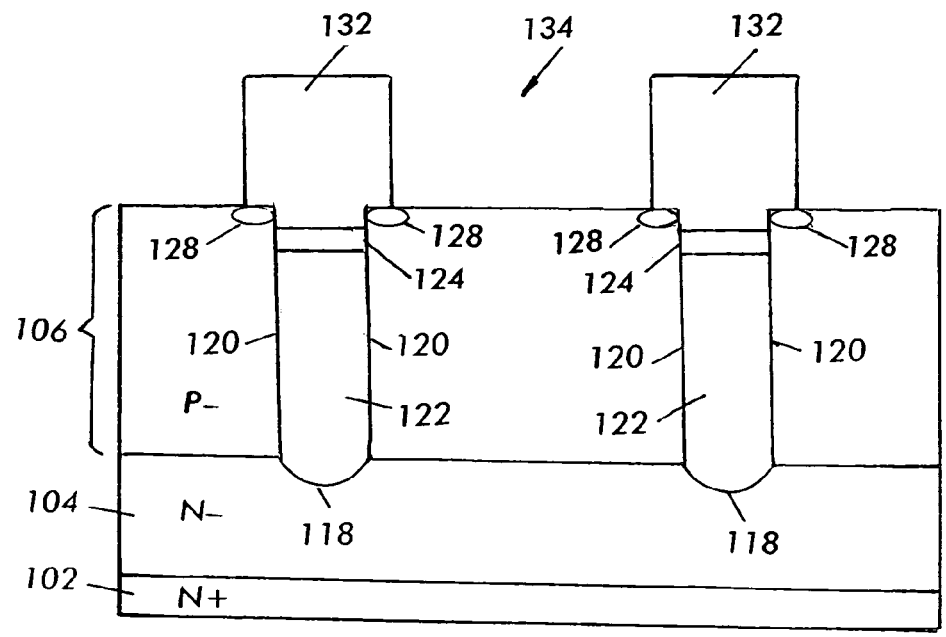

Referring to FIG. 3B, an appropriate etching process is next carried out to remove the remaining hard mask layer 110 and pad oxide layer 108. As a result, openings 134 are formed between adjacent insulation caps 132, with each opening now exposing the top surface of channel region 106. Thereafter and as illustrated in FIG. 3C, a second blanket source implant is carried out through openings 134 to form source implant regions 146 in channel region 106 in the area along the bottom of each opening 134.

Figure 3C:
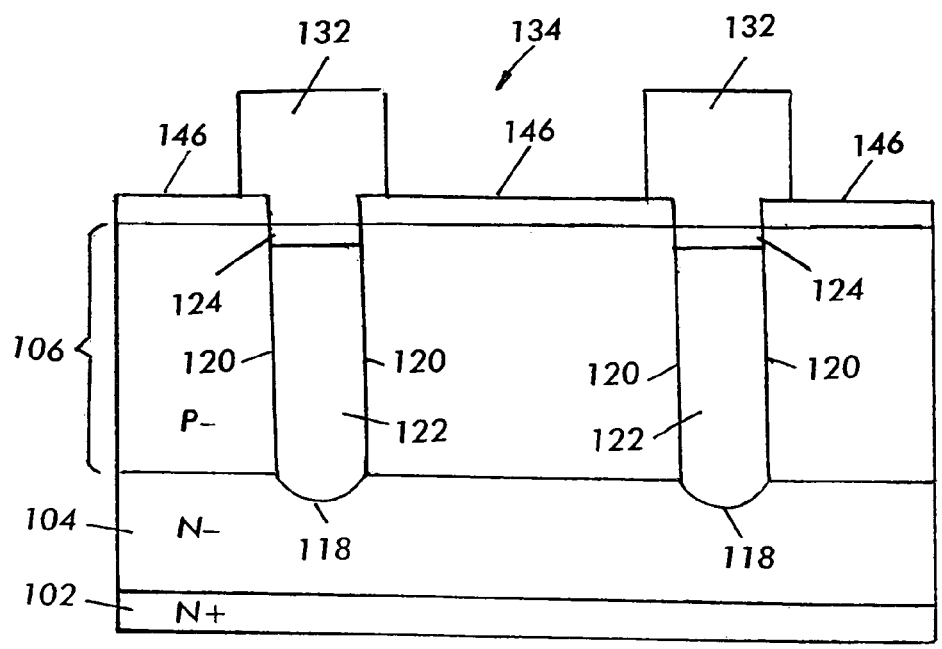
Figure 3D:
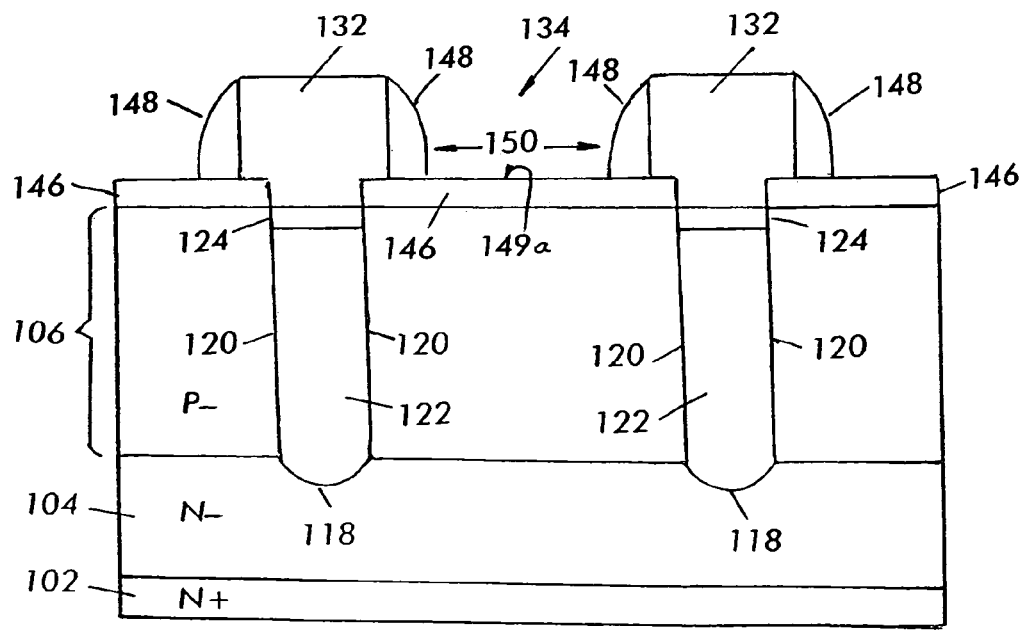

Referring to FIG. 3D, a second hard mask layer, preferably composed of silicon nitride ($Si_3Ni_4$), is then formed over the surface of the structure shown in FIG. 3C, filling openings 134 and covering the top surface of insulation caps 132. This second mask layer is then etched back, removing the mask layer from the top surface of insulation caps 132 and forming outside spacers 148 along the walls of insulation caps 132. Again, spacers 148 form openings of a desired width/cross-section 150 that are aligned between adjacent insulation caps 132 and thereby adjacent trenches 118. As shown in FIG. 3D, spacers 148 are sized such that a desired portion of source implant regions 146 is exposed (as illustrated by arrow 149a).

Figure 3E:
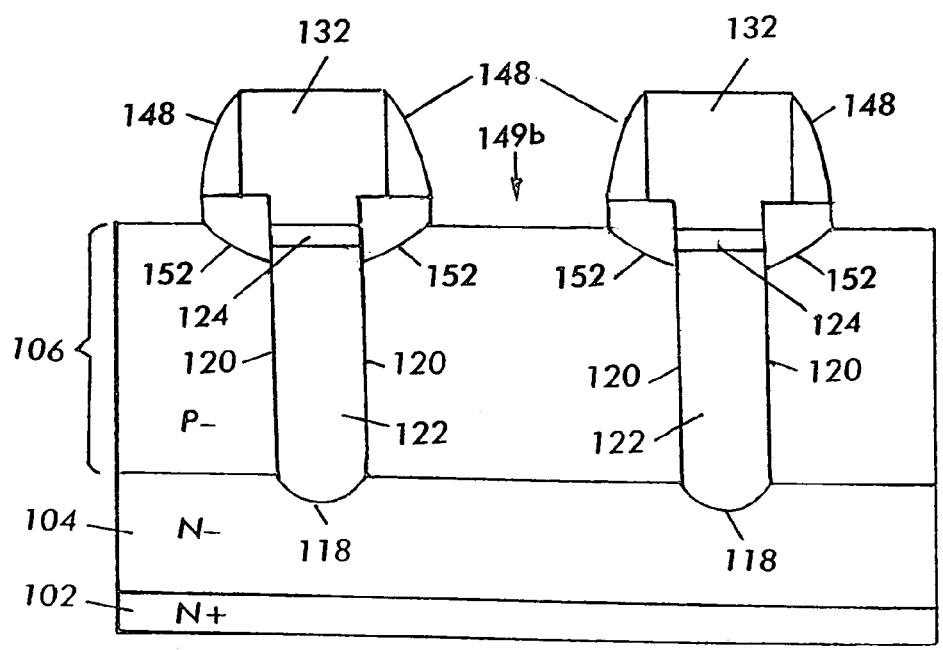

Next, a contact etch is performed through outside spacers 148, along cross-sections 150, thereby using spacers 148 as a mask. This contact etch removes source implant regions 146 in the area designated by arrow 149a in FIG. 3D, thereby exposing a portion of the top surface of channel region 106. As illustrated in FIG. 3E, a source diffusion drive is then carried out to drive the remaining portions of source implant regions 146 (i.e., the portions masked by spacers 148), thereby forming source regions 152. As illustrated and as compared to the first embodiment, this two-phase source implant process for forming source regions 152 of this second embodiment results in shallower source regions. At least one benefit of these shallower source regions is that there is less lateral diffusion of the regions. Again, this is beneficial because it allows for the distance between adjacent trenches to be reduced.

Figure 3F:
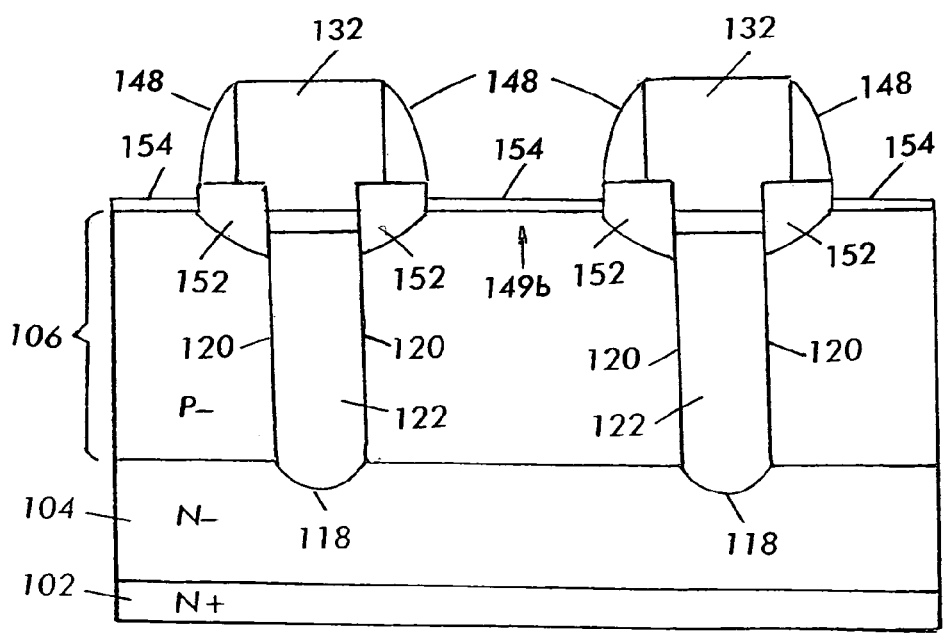

Referring to FIG. 3F, dopants of the same conductivity as channel region 106 are next implanted in channel region 106 along the etched region created by the contact etch (i.e., the area designated by arrow 149b in FIG. 3E) and after a diffusion drive, high conductivity contact regions 154 are formed. Again, through the use of inside spacers 114 and outside spacers 148, source regions 152 and high conductivity contact regions 154 are self-aligned between each other and trenches 118, thereby allowing the distance between adjacent trenches 118 to be reduced.

Figure 3G:
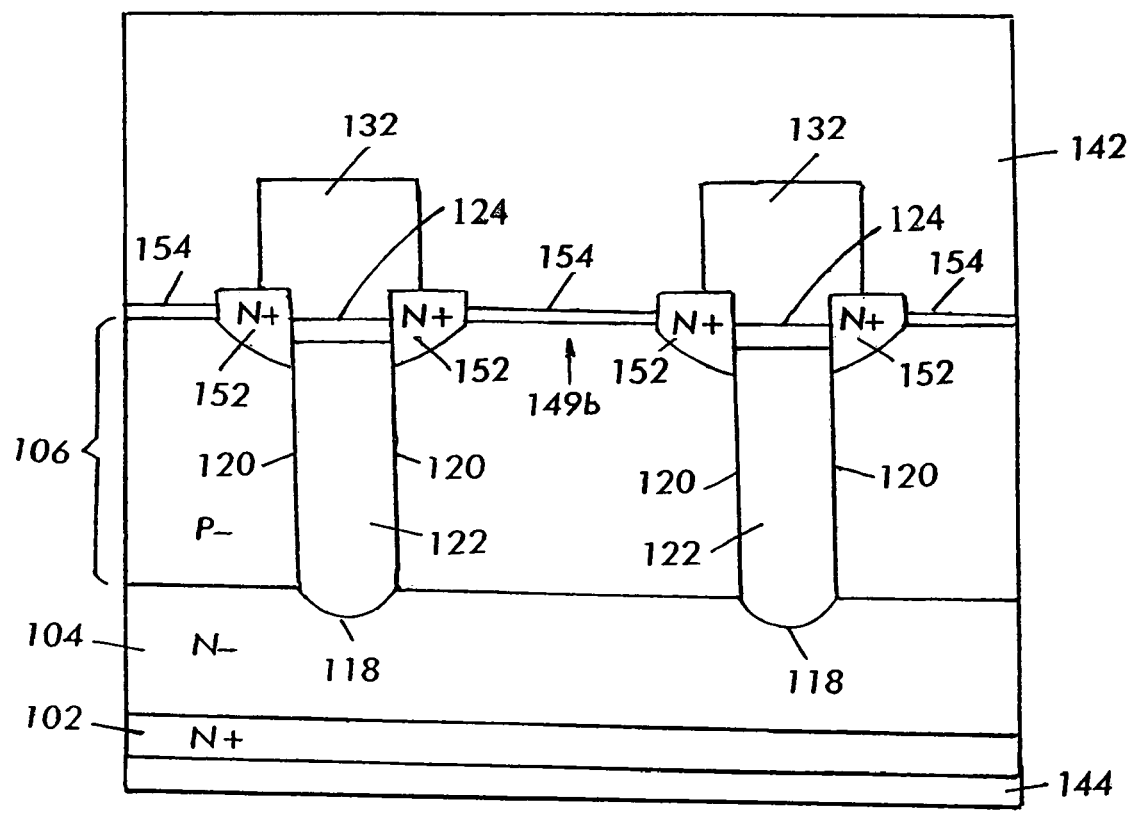

Finally, referring to FIG. 3G, outside spacers 148 are stripped and a front metal and back metal are applied using known methods to obtain source contact 142 and drain contact 144.

Referring now to FIGS. 4A-4H, a power MOSFET fabrication process according to a third embodiment of the invention is illustrated. This process is similar to the first and second embodiments and in particular, uses a two-phase source implant to create shallower source regions. However, the fabrication process of this third embodiment also results in larger gate electrodes, as compared to the first and second embodiments, and in particular, electrodes that extend up to and optionally above the top surface of the semiconductor body. As indicated above, thinner trenches result in smaller gate electrodes, which increases gate resistance. Among other benefits, by creating larger electrodes in accordance with this third embodiment of the invention, gate resistance is reduced.

Accordingly, the process of this third embodiment proceeds as described above for the first embodiment through FIG. 2D. Thereafter, gate insulation layers 120 are formed on the sidewalls and bottom surfaces of trenches 118. An undoped polysilicon is then deposited over the surface of the structure and doped with a suitable dopant. The doped polysilicon is then removed from the surface of the structure through appropriate masking and etching in order to produce gate electrodes 156 within trenches 118, as now illustrated in FIG. 4A. Again, silicide or salicide contacts 158 can optionally be formed over the top ends of each gate electrode 156 to reduce the local resistive value. Significantly, note that the polysilicon of gate electrodes 156 now extends to the upper edges of trenches 118 and to the top surface of channel region 106. Note also that if silicide/salicide contacts 158 are included, these contacts extend out of the trenches and above the top surface of channel region 106.

Figure 4A:
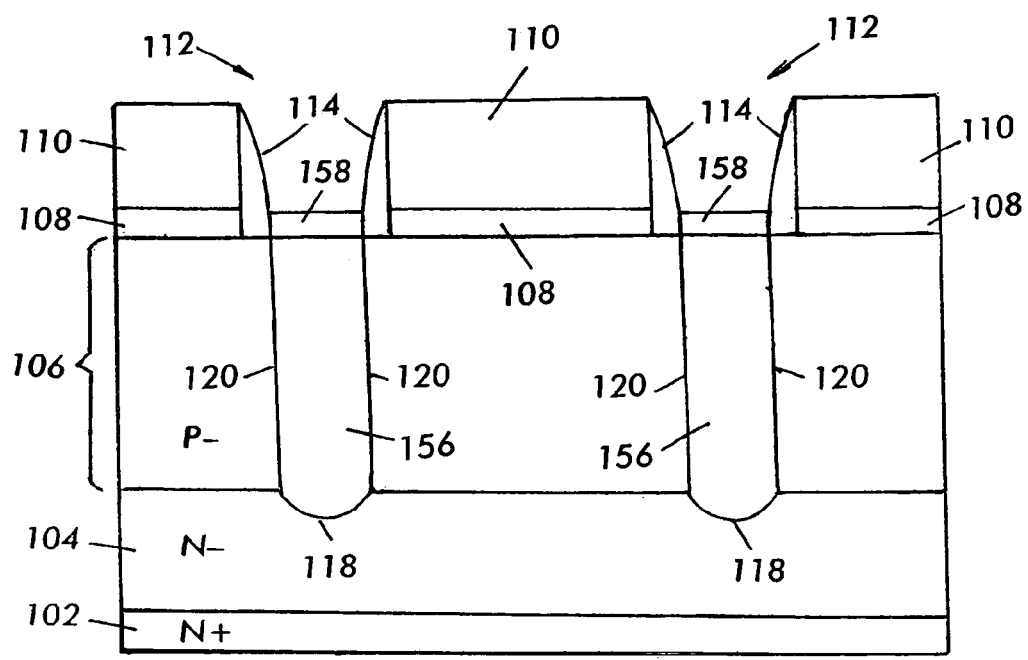
FIGS. 4A-4H graphically illustrate a fabrication process for a trench type power MOSFET according to a third embodiment of the present invention, the resulting MOSFET having shallow source regions, similar to the second embodiment, and also having gate electrodes that extend above the top surface of the semiconductor body.
Figure 4B:
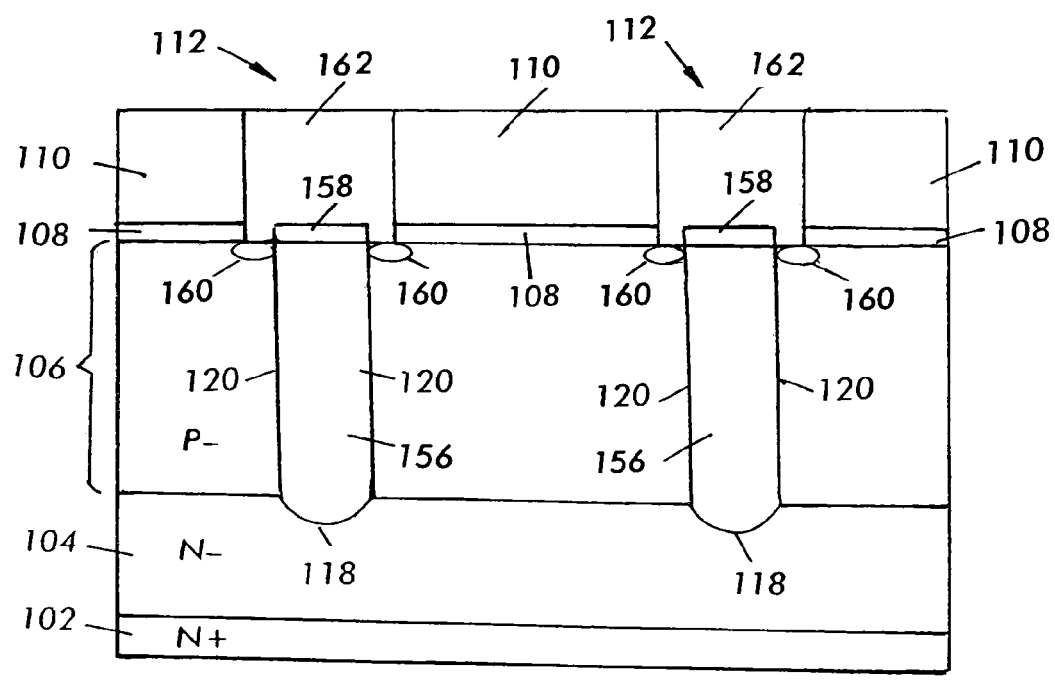

Referring to FIG. 4B, inside spacers 114 are next removed exposing a portion of channel region 108 along the upper edges of each trench 118. The process then proceeds similar to the second embodiment for the formation of the source regions. Specifically, a first source implant is next carried out to form source implant regions 160 in channel region 106 along the upper edges of each trench 118. However, again, a source diffusion drive is not carried out. Rather, a layer of oxide, composed from TEOS or the like for example, is formed over the surface of the structure, covering hard mask layer 110 and filling openings 112. This oxide layer is then etched back, forming insulation caps 162 over the gate electrodes 156. The resulting structure is shown in FIG. 4B.

Figure 4C:
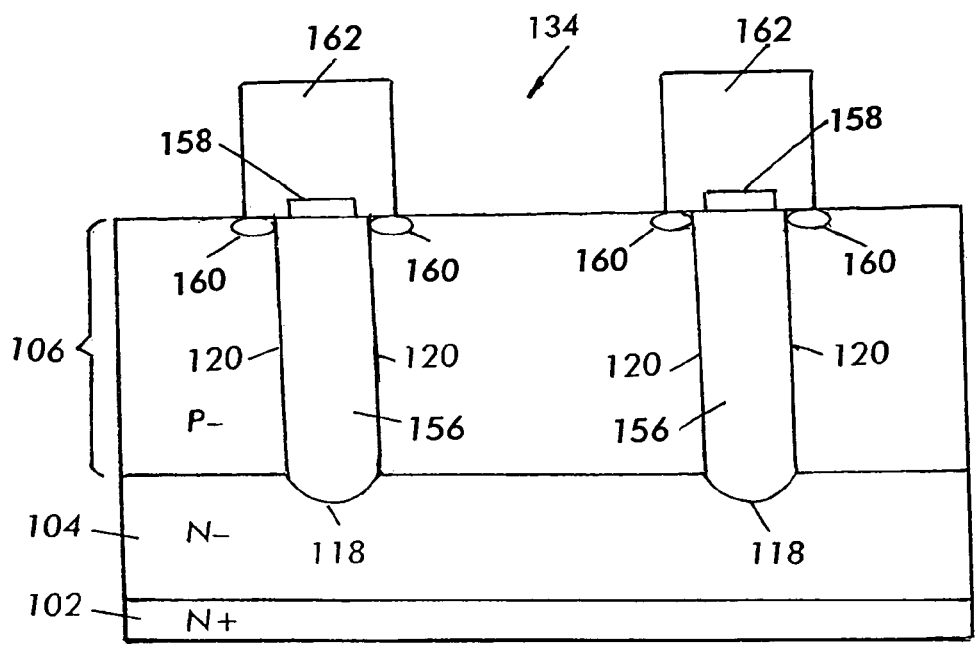

Referring to FIG. 4C, an appropriate etching process is next carried out to remove the remaining hard mask layer 110 and pad oxide layer 108. As a result, openings 134 are formed between adjacent insulation caps 162, with each opening exposing the top surface of channel region 106. Thereafter and as illustrated in FIG. 4D, a second blanket source implant is carried out through openings 134 to form source implant regions 164 in channel region 106 in the area along the bottom of each opening 134.

Figure 4D:
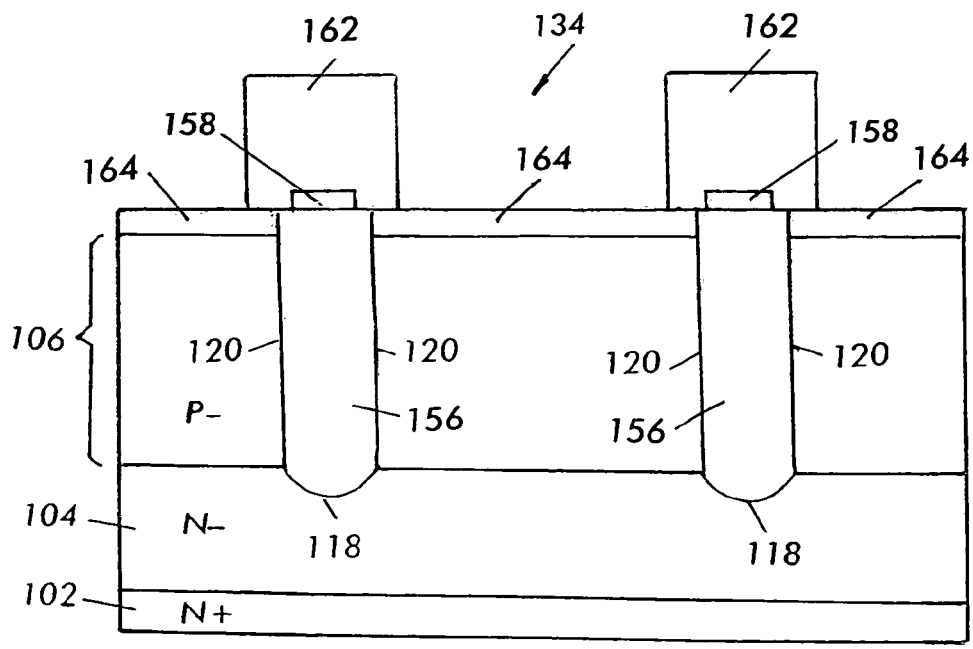
Figure 4E:
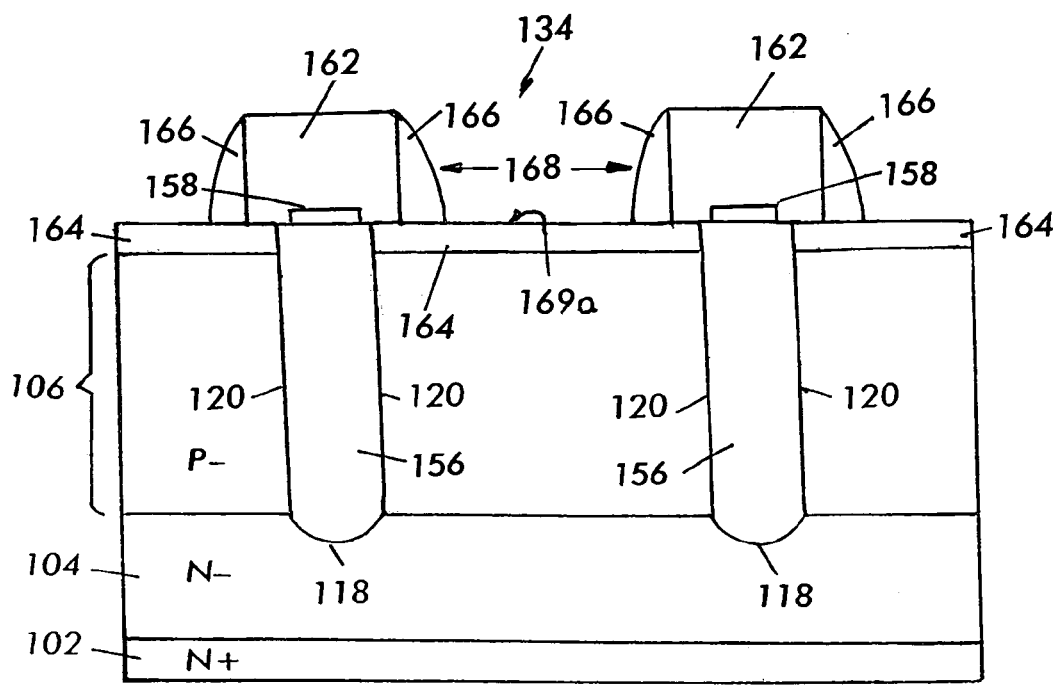

Referring to FIG. 4E, a second hard mask layer, preferably composed of silicon nitride ($Si_3Ni_4$), is formed over the surface of the structure shown in FIG. 4D, filling trenches 134 and covering the top surface of insulation caps 162. This second mask layer is then etched back, removing the mask layer from the top surface of insulation caps 162 and forming outside spacers 166 along the walls of insulation caps 162. Again, spacers 166 form openings of a desired width/cross-section 168 that are aligned between adjacent insulation caps 162 and thereby adjacent trenches 118. As shown in FIG. 4E, spacers 166 are sized such that a desired portion of source implant regions 164 is exposed (as illustrated by arrow 169a).

Figure 4F:
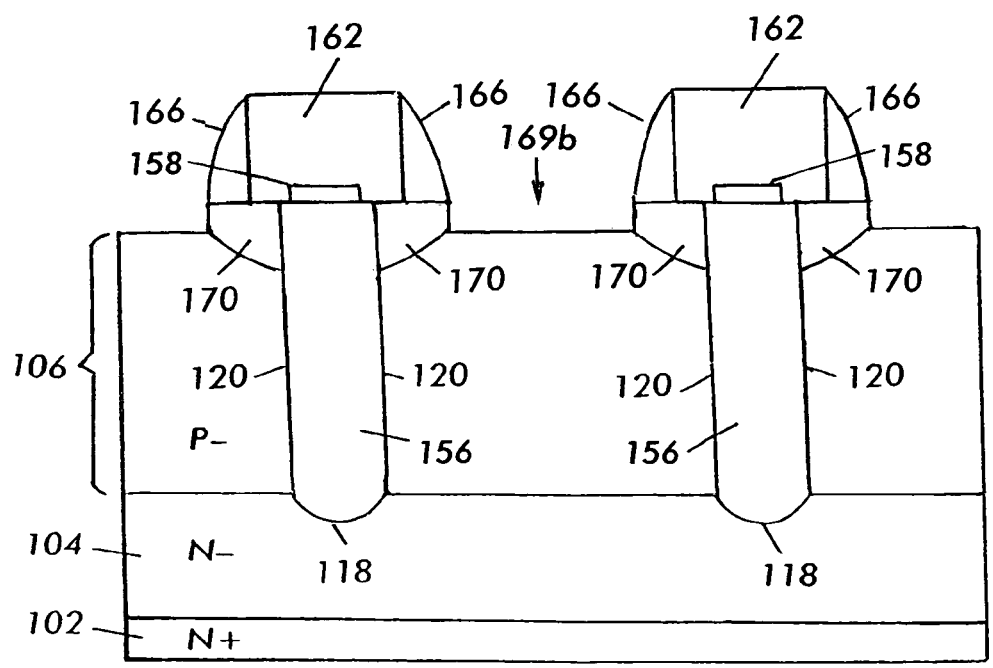

Next, using outside spacers 166 as a mask, a contact etch is performed through the spacers, removing source implant regions 164 in the area designated by arrow 169a in FIG. 4E. As a result, a portion of the top surface of channel region 106 is now exposed. A source diffusion drive is then carried out to drive the remaining portions of the source implant regions 164 (i.e., the portions masked by spacers 166), thereby forming source regions 170. The resulting structure is illustrated in FIG. 4F.

Figure 4G:
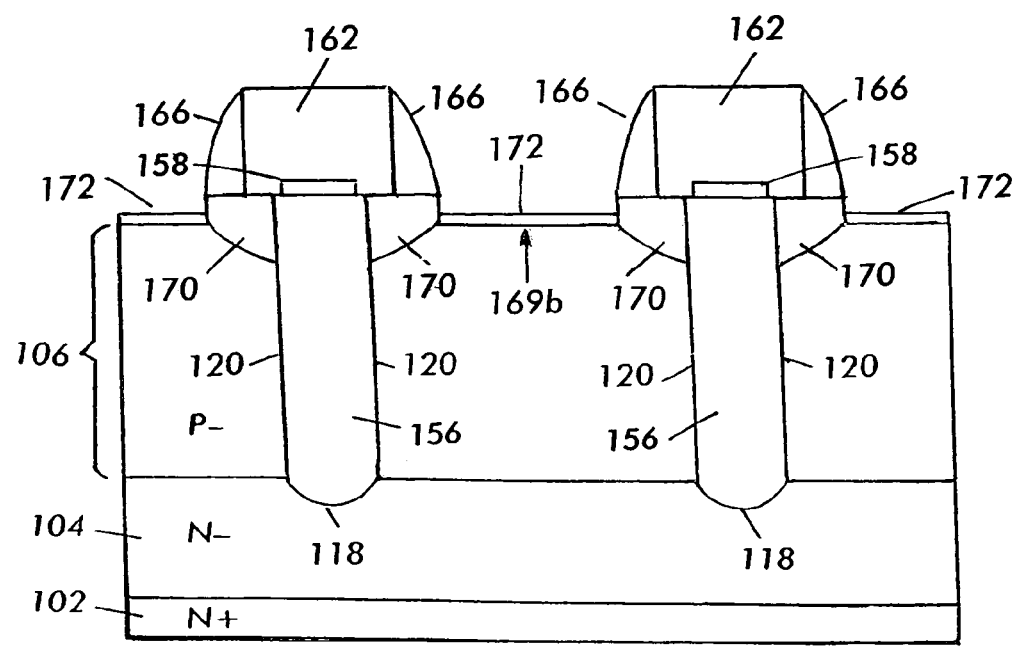

Referring to FIG. 4G, dopants of the same conductivity as channel region 106 are next implanted in channel region 106 along the etched region created by the contact etch (i.e., the area designated by arrow 169b in FIG. 4F) and after a diffusion drive, high conductivity contact regions 172 are formed.

Figure 4H:
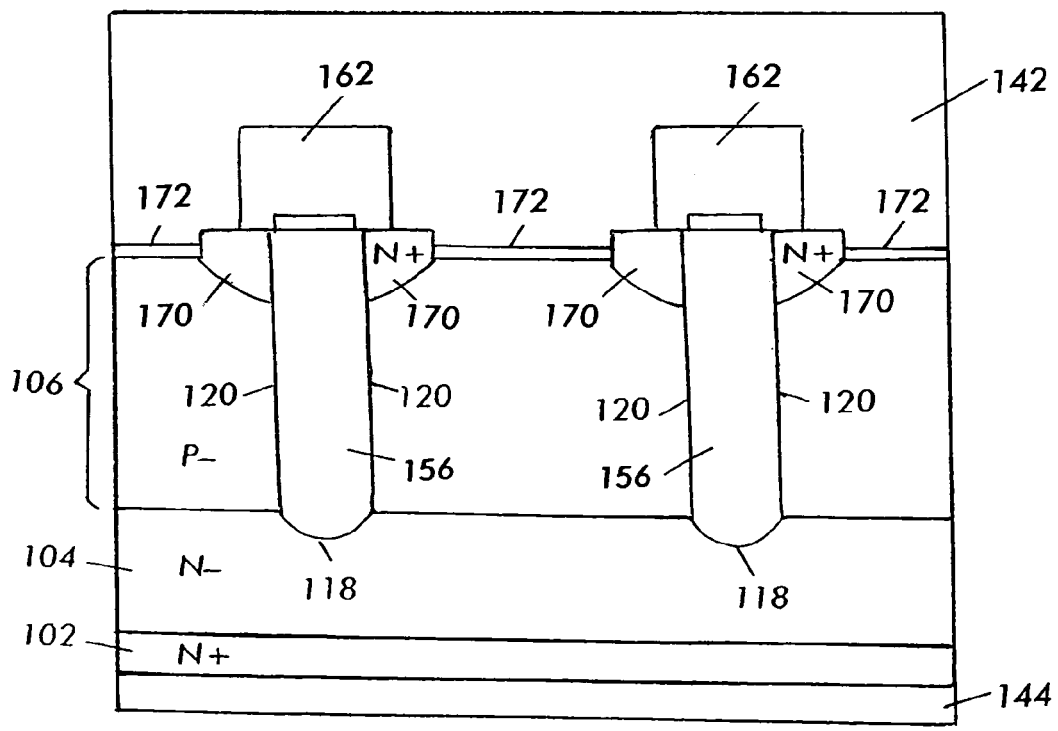

Finally, referring to FIG. 4H, outside spacers 166 are stripped and a front metal and back metal are applied using known methods to obtain source contact 142 and drain contact 144.

Note that FIGS. 2A-2L, FIGS. 3A-3G, and FIG. 4A-4H show N-type trench MOSFETs. Nonetheless, one skilled in the art will realize that the above processes also apply to P-type trench MOSFETS.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A method for fabricating a power semiconductor device, comprising the steps of:
  forming a mask layer over a surface of a semiconductor body of a first conductivity;
  patterning said mask layer with a plurality of first openings, wherein each of said first plurality of openings extends to and thereby exposes the surface of said semiconductor body;
  forming inside spacers along sidewalls of each of said first plurality of openings;

defining a plurality of trenches in said semiconductor body by etching through said inside spacers;
forming a gate electrode in each of said plurality of trenches;
forming an insulation cap over each of said gate electrodes;
forming outside spacers along sidewalls of each of said insulation caps, wherein said outside spacers define second openings exposing the surface of said semiconductor body; and
using said outside spacers to form regions of a second conductivity along the surface of said semiconductor body.

2. The method of claim 1, further comprising the steps of:
removing said inside spacers after forming said gate electrodes; and
removing said outside spacers after forming said regions of said second conductivity.

3. The method of claim 1, wherein said inside spacers are comprised of silicon dioxide.

4. The method of claim 1, wherein said outside spacers are comprised of silicon nitride.

5. The method of claim 1, wherein said gate electrodes include a top end that is recessed below the surface of the semiconductor body.

6. The method of claim 5, further comprising, prior to said insulation cap forming step, the step of siliciding each of said gate electrodes at its top end, wherein said silicided gate electrodes are recessed below the surface of said semiconductor body.

7. The method of claim 1, wherein said gate electrodes include a top end that extends at least to the surface of the semiconductor body.

8. The method of claim 7, further comprising, prior to said insulation cap forming step, the step of siliciding each of said gate electrodes at its top end, wherein said silicided gate electrodes extend above the surface of said semiconductor body.

9. The method of claim 1, further comprising forming a channel region of said second conductivity in said semiconductor body such that said channel region extends from the surface of the semiconductor body to a first depth of said semiconductor body, wherein said plurality of trenches extend to a depth below the first depth.

10. The method of claim 1, wherein said outside spacers using step comprises the steps of:
contacting etching the surface of the semiconductor body through said outside spacers thereby forming etched regions; and
forming said regions of said second conductivity along said etched regions.

11. The method of claim 1, further comprising after said gate electrodes forming step the steps of:
removing said inside spacers;
forming implant regions of said first conductivity in the surface of said semiconductor body along upper edges of each of said plurality of trenches; and
driving said implant regions to form a plurality of source regions.

12. The method of claim 11, wherein said plurality of source regions extend laterally along the surface of the semiconductor body such that said second openings defined by said second spacers expose a section of each of said source regions and wherein said outside spacers using step comprises the step of contact etching a portion of each of said exposed section of said source regions.

13. The method of claim 1, further comprising after said gate electrodes forming step the steps of:
removing said inside spacers;
forming first implant regions of said first conductivity in the surface of said semiconductor body along upper edges of each of said plurality of trenches; and
forming, prior to forming said outside spacers, second implant regions of said first conductivity in the surface of said semiconductor body.

14. The method of claim 13, wherein said second openings defined by said outside spacers expose a section of each of said second implant regions and wherein said outside spacers using step comprises the step of completely removing said exposed section of each of said second implant regions.

15. The method of claim 14, further comprising after said exposed section removing step the step of driving remaining first and second implant regions to form a plurality of source regions.

16. A method for fabricating a power semiconductor device, comprising the steps of:
forming a plurality of inside spacers over a surface of a semiconductor body of a first conductivity, wherein said plurality of inside spacers form a first plurality of openings that expose the surface of said semiconductor body;
defining a plurality of trenches in said semiconductor body by etching said semiconductor body through said first plurality of openings;
forming gate electrodes in each of said plurality of trenches;
removing said plurality of inside spacers and forming, through self alignment, source implant regions of said first conductivity in the surface of said semiconductor body along upper edges of each of said plurality of trenches;
forming a plurality of outside spacers over the surface of said semiconductor body, wherein said plurality of outside spacers form a second plurality of openings that expose the surface of said semiconductor body;
forming, through said second plurality of openings, regions of a second conductivity in the surface of said semiconductor body; and
removing said plurality of outside spacers.

17. The method of claim 16, wherein said plurality of inside spacers are comprised of silicon dioxide and said plurality of outside spacers are comprised of silicon nitride.

18. The method of claim 16, wherein said gate electrodes each include a silicided top end that is recessed below the surface of the semiconductor body.

19. The method of claim 16, wherein said gate electrodes each include a silicided top end that extends above the surface of the semiconductor body.

20. The method of claim 16, further comprising after said step of forming source implant regions the steps of:
forming insulation caps over said gate electrodes and over said source implant regions; and
forming second source implant regions of said first conductivity in the surface of said semiconductor body between said insulation caps.

* * * * *